US008043790B2

(12) United States Patent
Wada et al.

(10) Patent No.: US 8,043,790 B2

(45) Date of Patent: Oct. 25, 2011

(54) PRINTING ORIGINAL PLATE CAPABLE OF BEING LASER-ENGRAVED

(75) Inventors: Toru Wada, Okayama (JP); Kazuya Yoshimoto, Okayama (JP)

(73) Assignee: Toyo Boseki Kabushki Kaisha, Osaka (JP)

( * ) Notice: Subject to any disclaimer, the term of this patent is extended or adjusted under 35 U.S.C. 154(b) by 0 days.

(21) Appl. No.: 12/517,082

(22) PCT Filed: Nov. 30, 2007

(86) PCT No.: PCT/JP2007/001330

§ 371 (c)(1),
(2), (4) Date: Jun. 1, 2009

(87) PCT Pub. No.: WO2008/075451

PCT Pub. Date: Jun. 26, 2008

(65) Prior Publication Data

US 2010/0081083 A1 Apr. 1, 2010

(30) Foreign Application Priority Data

Dec. 18, 2006 (JP) ................................ 2006-339298

(51) Int. Cl.
*G03F 1/00* (2006.01)
*G03F 7/00* (2006.01)

(52) U.S. Cl. ................................. 430/270.1; 430/281.1

(58) Field of Classification Search ................ 430/270.1
See application file for complete search history.

(56) References Cited

U.S. PATENT DOCUMENTS

| | | | | | |
|---|---|---|---|---|---|
| 4,220,704 | A * | 9/1980 | Etoh et al. | 430/281.1 |
| 5,648,420 | A * | 7/1997 | Fujiwara et al. | 524/750 |
| 6,136,918 | A * | 10/2000 | Mishima et al. | 524/804 |
| 6,403,284 | B1 * | 6/2002 | Yoshida | 430/309 |
| 7,645,563 | B2 * | 1/2010 | Wada et al. | 430/281.1 |
| 2002/0072013 | A1 | 6/2002 | Vander Aa | |
| 2007/0084369 | A1 | 4/2007 | Kodama et al. | |
| 2007/0248909 | A1 * | 10/2007 | Takagi et al. | 430/270.1 |
| 2009/0220753 | A1 * | 9/2009 | Sugasaki | 428/195.1 |

FOREIGN PATENT DOCUMENTS

| | | | |
|---|---|---|---|
| EP | 1491 331 | A | 12/2004 |
| EP | 1 516 745 | A | 3/2005 |
| EP | 1516745 | A1 * | 3/2005 |
| EP | 1 630 609 | A | 3/2006 |
| EP | 1630609 | A1 * | 3/2006 |
| EP | 1 710 093 | A | 10/2006 |
| EP | 1 801 145 | A | 6/2007 |
| JP | 2004-533343 | | 11/2004 |
| JP | 2006-206872 | | 8/2006 |

* cited by examiner

*Primary Examiner* — Cynthia Kelly
*Assistant Examiner* — Chanceity Robinson
(74) *Attorney, Agent, or Firm* — Fish & Richardson P.C.

(57) ABSTRACT

The present invention provides a printing original plate for laser engraving which generates no printing deficiencies and from which a printing plate with a satisfactory resolution can be produced. A printing original plate for laser engraving which is obtained by molding a resin composition containing (A) at least one latex having a weight average degree of gelation of 75% or more, (B) a photopolymerizable compound and (C) a photopolymerization initiator into a sheet-like or tubular form, and then irradiating the molded article with light to crosslink and cure, characterized in that the depth of 10% screen dot at 150 lpi is 80 μm or more.

11 Claims, No Drawings

PRINTING ORIGINAL PLATE CAPABLE OF BEING LASER-ENGRAVED

TECHNICAL FIELD OF THE INVENTION

The present invention relates to a printing original plate for laser engraving produced by using, as a major component of an image-forming material, a latex having been highly gelled, and particularly to a printing original plate for laser engraving from which a printing plate can be obtained which has both reduced printing deficiencies and an improved resolution in comparison to conventional products.

BACKGROUND ART

Printing plates for flexographic printing to be used for printing packaging materials, decorative building materials and the like have conventionally been produced by exposing a printing original plate made of a photosensitive resin to light imagewise to crosslink the resin in the exposed portion, and then washing off and removing the uncrosslinked resin in the unexposed portion. In recent years, however, printing plates produced by laser engraving have been spreading for the improvement in efficiency of printing plat production. In such printing plates, a relief image is formed directly on a printing original plate by the use of laser. In the process of producing a printing plate by laser engraving, projections and recesses are formed by decomposing an image-forming material in an irradiated portion through imagewise-irradiation of a printing original plate with a laser beam. During this process, a viscous residue is formed through the decomposition of the image-forming material in the laser-irradiated portion and some of the residue also scatters to the laser-unirradiated portion. Since the residue will cause a problem if it is left on a printing plate, it is removed from a printing plate by suction with a dust collector provided near a laser machine during the laser irradiation and/or by washing of the printing plate after the laser irradiation.

Conventionally known printing original plates for laser engraving include plates made from a resin composition prepared by incorporating a photopolymerizable compound and a photopolymerization initiator to a synthetic rubber or a natural rubber. Such a printing original plate, however, shows high tackiness because it contains a rubber as its major component and, therefore, a residue produced by laser irradiation is likely to be left adhered to the plate without being removed even if the sucking during the laser irradiation or the washing after the laser irradiation is performed. If a residue is left adhered to a laser-unirradiated portion (projecting portion) of a printing original plate, printing deficiency may occur because this portion is a part to which an ink is to be provided. Moreover, if a residue is left adhered to the bottom of a laser-irradiated portion (recessed portion) of the printing plate, the depth of a screen dot will decrease. If a residue is left adhered to a side surface of a recessed portion, the reproducibility of a screen dot will decrease. In both the events, decrease in resolution may be caused.

In order to cope with this problem, technologies to improve mechanical properties of a printing original plate by incorporating a laser-absorptive colored filler such as carbon black to a resin composition or by incorporating a colorless transparent filler such as silica microparticles to a resin composition so as to reduce the tackiness as a result have been proposed (cf. Japanese Patent Application Laid-Open (JP-A) No. 2004-533343). The method of incorporating a laser-absorptive filler such as carbon black, however, has a problem that since using a colored filler, the resin composition is made opaque, so that it becomes impossible to fully perform photo-curing by light irradiation. Further, while the method of incorporating a filler such as silica microparticles does not cause a problem like that caused in the case of incorporation of carbon black because the filler is colorless and transparent, it requires a large amount of filler in order to reduce the tackiness of a printing original plate sufficiently and it has a problem of remarkably impairing the moldability or the physical properties of a printing original plate. As mentioned above, the addition of a filler has some adverse effect on the moldability or the physical properties of a printing original plate. Therefore, a method by which the tackiness of a printing original plate can be reduced without adding a filler has been awaited to be developed.

DISCLOSURE OF THE INVENTION

Problem that the Invention is to Solve

The present invention was created in view of the present situation of such conventional technologies and an objective thereof is to provide a printing original plate for laser engraving which generates no printing deficiencies and from which a printing plate with a satisfactory resolution can be produced.

Means for Solving the Problem

The present inventors have earnestly investigated the composition of a resin composition which constitutes a printing original plate suitable for achieving the objective mentioned above. As a result, they have found that the tackiness of a printing original plate could be reduced and those problems could be overcome by using a highly gelled latex not a conventional rubber as the major component of a printing original plate. Thus, they have accomplished the present invention.

That is, according to the present invention, a printing original plate for laser engraving is provided which is obtained by molding a resin composition containing (A) at least one latex, (B) a photopolymerizable compound and (C) a photopolymerization initiator into a sheet-like or tubular form, and then irradiating the molded article with light to crosslink and cure, wherein said at least one latex has a weight average degree of gelation of 75% or more as a whole.

According to a preferable embodiment of the printing original plate of the present invention, the latex (A) is composed of a mixture of a gelled latex and an ungelled latex; the ungelled latex is an acrylonitrile-butadiene copolymer latex; the weight ratio of the ungelled latex in the latex (A) is 20% by weight or less; and the weight ratios of the latex (A), the photopolymerizable compound (B) and the photopolymerization initiator (C) in the resin composition are 10 to 80:15 to 80:0.1 to 10, respectively.

Advantages of the Invention

Since the printing original plate for laser engraving of the present invention uses a microparticulated latex instead of a rubber which has conventionally been used, it is low in tackiness. Furthermore, since the latex used in the printing original plate of the present invention is highly gelled, latex microparticles are prevented from aggregating to unite due to heating, pressurization or addition of a solvent in the production of a printing original plate and the latex can also maintain its low tackiness in a printing original plate. Therefore, if the printing original plate of the present invention is used, adhesion of a residue produced by laser irradiation can be inhibited effectively and, accordingly, no printing deficiency occurs and furthermore, a printing plate excellent in resolution can be produced.

BEST MODE FOR CARRYING OUT THE INVENTION

The printing original plate of the present invention is used as a printing original plate suitable for the formation of relief images for flexographic printing with laser engraving, the formation of patterns for surface treatment such as embossing, and the formation of relief images for printing on tile, etc., and which can be obtained by molding a resin composition containing (A) at least one latex having a weight average degree of gelation of 75% or more, (B) a photopolymerizable compound and (C) a photopolymerization initiator into a sheet-like or tubular form, and then irradiating the molded article with light to crosslink and cure.

The latex (A) which constitutes the resin composition of the present invention is the major component of an image forming material and has a role to be decomposed by image-wise-laser irradiation in a printing original plate, thereby forming a recessed portion. The present invention is characterized particularly by using, as a latex, at least one latex having a weight average degree of gelation of 75% or more. In the use of a latex having a low weight average degree of gelation, even if it exerts low tackiness when it is in the form of a resin composition, the tackiness will increase when it is processed into a printing original plate. The reason for this is that heating, pressurization or addition of a solvent upon molding the resin composition into a printing original plate makes latex microparticles fuse or aggregate to cluster or unite, so that the latex microparticles become incapable of existing in the form of microparticles. Therefore, in order to prevent latex microparticles from aggregating and uniting upon molding into a printing original plate and to thereby keep the low degree of tackiness even in the printing original plate, it is necessary to use a latex of a hard crosslinked material with a high weight average degree of gelation. Here, a latex is an emulsion in which a macromolecule such as a natural rubber, a synthetic rubber or a plastic is dispersed in the form of colloid in water through the action of an emulsifier, and it is classified, depending upon the type of production process, into (i) a natural rubber latex, which is a naturally occurring product due to vegetable metabolism, (ii) a synthetic rubber latex, which is synthesized by emulsion polymerization, and (iii) an artificial latex, which is prepared by emulsifying and dispersing a solid rubber in water. The latex (A) used in the present invention, however, includes only (ii) the synthetic rubber latex and (iii) the artificial latex and excludes (i) the natural rubber latex.

While the latex (A) used in the present invention may be composed of either a single kind of latex or a mixture of two or more kinds of latex, it is necessary that the weight average degree of gelation of the latex (A) be 75% or more. The weight average degree of gelation of the latex (A) is preferably 80% or more, more preferably 85% or more, and most preferably 90% or more. If the degree of gelation of the latex is less than the value shown above, latex microparticles cannot not be prevented sufficiently from aggregating or uniting upon molding into a printing original plate and, therefore, it may be impossible to keep the tackiness of the printing original plate low. Moreover, it may be impossible to secure a high resolution of a printing plate. On the other hand, there is no upper limit with the degree of gelation of the latex. The larger the degree of gelation is, the greater the effect of preventing latex microparticles from aggregating and uniting. Here, the value of the degree of gelation of a latex is defined by the insolubility in toluene. Specifically, the degree of gelation of a latex is determined by accurately weighing 3 g of a latex solution onto a PET film having a thickness of 100 μm, drying it at 100° C. for 1 hour, subsequently immersing the film in a toluene solution at 25° C. for 48 hours, then drying it at 110° C. for 2 hours, and calculating the amount in % by weight of the insoluble.

As the latex (A) to be used in the present invention, a latex having a degree of gelation at a certain level or higher may be selected appropriately from among conventional latices. For example, a polybutadiene latex, a styrene-butadiene copolymer latex, an acrylonitrile-butadiene copolymer latex, a methyl methacrylate-butadiene copolymer latex, etc. can be used.

Further, these latices may have been modified with (meth) acrylate, carboxy, etc. Here, because a variety of synthetic or natural latices as gelled latices are on the market, a proper one may be selected from among them as a gelled latex.

Moreover, as a latex (A), an ungelled latex or a latex having a low degree of gelation may also be used so far as the weight average degree of gelation of the whole latex becomes 75% or more. An ungelled latex is used in view of the ink transfer to a water-based ink or the removal of residue from a plate surface after laser engraving. An ungelled latex may be selected appropriately from among conventionally known latices. For example, a polybutadiene latex, a styrene-butadiene copolymer latex, an acrylonitrile-butadiene copolymer latex or the like can be used. In particular, it is preferable, from the aforesaid point of view, to use an acrylonitrile-butadiene copolymer latex.

The photopolymerizable compound (B) which constitutes the resin composition of the present invention has a role to polymerize and crosslink by light irradiation, thereby forming a dense network in a printing original plate for shape maintenance. The photopolymerizable compound (B) used in the present invention is preferably a photopolymerizable oligomer. Here, the photopolymerizable oligomer refers to a conjugated diene-based ethylenic polymer having a number average molecular weight of 1000 to 10000 in which an ethylenically unsaturated group is linked to a terminal and/or a side chain of a conjugated diene-based polymer.

The conjugated diene-based polymer which constitutes the conjugated diene-based ethylenic polymer is formed of a homopolymer of a conjugated diene unsaturated compound or a copolymer of a conjugated diene unsaturated compound and a monoethylenically unsaturated compound. Examples of such a homopolymer of a conjugated diene unsaturated compound or a copolymer of a conjugated diene unsaturated compound and a monoethylenically unsaturated compound include a butadiene polymer, an isoprene polymer, a chloroprene polymer, a styrene-chloroprene copolymer, an acrylonitrile-butadiene copolymer, an acrylonitrile-isoprene copolymer, a methyl methacrylate-isoprene copolymer, a methyl methacrylate-chloroprene copolymer, a methyl acrylate-butadiene copolymer, a methyl acrylate-isoprene copolymer, a methyl acrylate-chloroprene copolymer, an acrylonitrile-butadiene-styrene copolymer and an acrylonitrile-chloroprene-styrene copolymer. Among these, a butadiene polymer, an isoprene polymer and an acrylonitrile-butadiene copolymer are preferable, and a butadiene polymer and an isoprene polymer are particularly preferable from the viewpoint of rubber elasticity and photocurability.

While the method for introducing an ethylenically unsaturated group into a terminal and/or a side chain of a conjugated diene-based polymer is not particularly restricted, the method may be, for example, (1) a method in which a monoethylenically unsaturated carboxylic acid such as (meth) acrylic acid is ester-linked through dehydration to a hydroxyl group at a terminal of a hydroxyl group-terminated conjugated diene-based polymer obtained by using hydrogen peroxide as a polymerization initiator or a alkyl monoethylenically unsaturated carboxylate, such as methyl (meth)acrylate and ethyl (meth)acrylate, is ester-linked through transesterification, or (2) a method in which an ethylenically unsaturated alcohol, such as allyl alcohol and vinyl alcohol, is caused to react with a conjugated diene-based polymer obtained by copolymerizing a conjugated diene compound and an ethylenically unsaturated compound containing an unsaturated carboxylic acid (ester) in at least apart thereof.

The amount of the ethylenically unsaturated group in the conjugated diene-based ethylenic polymer is preferably 0.005 to 2.0 mEq/g, and particularly preferably 0.01 to 2.0 mEq/g in the polymer. If the amount is greater than 2.0 mEq/g, the hardness becomes so high that it becomes difficult to obtain a sufficient elasticity and the ink transfer of a solid part at the time of printing will deteriorate. If the amount is less than 0.005 mEq/g, the hardness becomes so low that it becomes difficult to obtain a sufficient hardness and the dot gain in printing will become so large that the printing accuracy will deteriorate.

In addition to the compounds provided as examples above, a photopolymerizable compound which is generally used, such as acrylates and methacrylates, may, as needed, be used as the photopolymerizable compound (B) of the present invention unless the effect of the present invention is impaired.

The photopolymerization initiator (C) which constitutes the resin composition of the present invention has a role as a catalyst for photopolymerization and crosslinking reaction of the photopolymerizable compound (B). While any compound capable of causing a polymerizable carbon-carbon unsaturated group to polymerize by light irradiation can be used as the photopolymerization initiator (C) used in the present invention, a compound which has a function of generating a radical through self decomposition or hydrogen extraction caused by light absorption is used preferably. Specifically, benzoin alkyl ethers, benzophenones, anthraquinones, benzyls, acetophenones, diacetyls and the like, for example, can be used.

The weight ratios of the latex (A), the photopolymerizable compound (B) and the photopolymerization initiator (C) in the resin composition of the present invention are preferably 10 to 80:15 to 80:0.1 to 10, respectively.

If the weight ratio of the latex (A) is less than the lower limit shown above, the proportion of particles which fuse or aggregate at the time of molding into a printing original plate will become larger and the tackiness of a printing original plate may increase. Further, if the weight ratio of the latex (A) exceeds the upper limit shown above, the fluidity of the resin composition greatly deteriorates and it may become difficult to mold the resin composition into a printing original plate. Further, if the weight ratio of the photopolymerizable compound (B) is less than the lower limit shown above, the curability of a printing original plate after photopolymerization may remarkably deteriorate or the mechanical properties of the printing original plate may remarkably deteriorate. Further, if the weight ratio of the photopolymerizable compound (B) exceeds the upper limit shown above, the composition cannot keep a solid state and it may become difficult to mold the resin composition into a printing original plate. Further, if the weight ratio of the photopolymerization initiator (C) is less than the lower limit shown above, the curability of a printing original plate after photopolymerization may remarkably deteriorate or the mechanical properties of the printing original plate may remarkably deteriorate. Further, if the weight ratio of the photopolymerization initiator (C) exceeds the upper limit shown above, the curability in the thickness direction of a printing original plate may remarkably deteriorate and it may be difficult to cure the whole original plate.

In the resin composition of the present invention, optional components such as a hydrophillic polymer, a plasticizer and/or a polymerization inhibitor may be incorporated, if desired, in addition to the aforementioned three components (A) to (C).

The hydrophilic polymer has an effect of improving affinity between a printing plate and a water-based ink in flexographic printing using the printing plate produced and, thereby improving printing properties. Hydrophilic polymers which can be used in the resin composition of the present invention preferably include polymers having a hydrophilic group such as —COOH, —COOM (M is a monovalent, divalent or trivalent metal ion or a substituted or unsubstituted ammonium ion), —OH, —$NH_2$, —$SO_3H$ and a phosphate group, and specifically include a polymer of (meth) acrylic acid or salts thereof, a copolymer of (meth) acrylic acid or salts thereof with an alkyl (meth) acrylate, a copolymer of (meth) acrylic acid or salts thereof with styrene, a copolymer of (meth) acrylic acid or salts thereof with vinyl acetate, a copolymer of (meth) acrylic acid or salts thereof with acrylonitrile, polyvinyl alcohol, carboxymethylcellulose, polyacrylamide, hydroxyethylcellulose, polyethylene oxide, polyethyleneimine, polyurethane which has a —COOM group, polyurea urethane which has a —COOM group, polyamide acid which has a —COOM group, and salts or derivatives thereof. These may be used solely or two or more polymers may be used in combination. The incorporated proportion of the hydrophillic polymer in the resin composition of the present invention is preferably 20% by weight or less, and more preferably 15% by weight or less. If the incorporated amount of the hydrophilic polymer exceeds the upper limit shown above, a printing plate to be produced may deteriorate in water resistance and deteriorate in water-based ink resistance.

A plasticizer has an effect of improving the fluidity of a resin composition and an effect of adjusting the hardness of a printing original plate to be produced. The plasticizer capable of being used in the resin composition of the present invention is preferably a product which is good in compatibility with the latex (A), and more preferably a polyene compound which is liquid at room temperature or a compound having an ester linkage. Examples of the polyene compound which is liquid at room temperature are liquid polybutadiene, polyisoprene, and their maleinated derivatives and epoxidized derivatives resulting from modification of their terminal groups or side chains. Examples of the compound having an ester linkage include phthalates, phosphates, sebacates, adipates and polyesters having molecular weight of 1000 to 3000. The incorporated proportion of the plasticizer in the resin composition of the present invention is preferably 30% by weight or less, and more preferably 20% by weight or less. If the incorporated amount of the plasticizer exceeds the upper limit shown above, a printing plate may deteriorate greatly in mechanical properties and solvent resistance and may deteriorate in printing durability.

The polymerization inhibitor has an effect of increasing the thermal stability of a resin composition. Polymerization inhibitors which can be used for the resin composition of the present invention may be conventionally known products, and examples thereof include phenols, hydroquinones and catechols. The incorporated proportion of the polymerization inhibitor in the resin composition of the present invention is preferably 0.001 to 3% by weight, and more preferably 0.001 to 2% by weight.

Moreover, a colorant, an antioxidant, etc. may also be added as optional components other than those mentioned above, unless the effect of the present invention is impaired.

The resin composition of the present invention is prepared by mixing the aforementioned three essential components (A) to (C) and, if desired, optional components. In this operation, an organic solvent such as toluene may be added, if desired, in order to make the mixing easier. Further, in order to mix completely, it is desirable to fully knead the components under a heating condition using a kneader. The heating condition is preferably about 50 to about 110° C. Further, the moisture contained in the organic solvent added at the time of mixing and in the components is preferably removed under reduced pressure after the kneading.

The printing original plate of the present invention is obtained by molding the resin composition of the present invention prepared as described above into a sheet-like or tubular form, and then irradiating the molded article with light to crosslink and cure.

A conventionally known resin molding method can be used as the method for molding the resin composition of the present invention into a sheet-like or tubular form. For example, a method can be mentioned which includes the application of the resin composition of the present invention onto an appropriate support or a cylinder of a printer, followed by pressurizing with a heat pressing machine, or the like. A material is preferably used which has flexibility and is excellent in dimension stability as the support. Examples thereof include a polyethylene terephthalate film, a polyethylene naphthalate film, a polybutylene terephthalate film and polycarbonate. In view of mechanical properties, stability in shape, etc. of a printing original plate, the thickness of the support is preferably 50 to 250 μm, and more preferably 100 to 200 μm. Further, if necessary, in order to improve the adhesion between the support and a resin layer, a known adhesive may be provided which has heretofore been used for this kind of purpose on the surface of the support. The condition of the pressurization is preferably about 20 to 200 $kg/cm^2$. The temperature condition in the pressurization is preferably about room temperature to about 150° C. While the thickness of a molded article to be formed may be determined appropriately according to the size, property and on the like of a printing original plate to be produced and is not specifically limited, it is ordinarily about 0.1 to about 10 mm.

The molded resin composition is subsequently irradiated with light, so that the photopolymerizable compound (B) in the resin composition is polymerized and crosslinked and whereby the molded article is cured to form a printing original plate. Examples of the light source to be used for the curing include such as a high-pressure mercury lamp, an ultrahigh-pressure mercury lamp, an ultraviolet fluorescent lamp, a carbon-arc lamp and a xenon lamp. Also, the curing can be performed by any conventionally known method other than the above. While only a single type of light source may be used as the light source for the curing, the curability of the resin may increase when curing is performed by the use of two or more types of light sources which differ in wavelength. Therefore, two or more types of light sources may be used.

The printing original plate thus obtained is mounted on the surface of a plate-mounting drum of a laser engraving device. By imagewise-laser irradiation, an original plate of the irradiated portion is decomposed to form a recessed portion and a printing plate is produced. In the printing original plate obtained from the resin composition of the present invention, since tackiness has been reduced due to the use of a latex with a gelation degree at a certain level or higher, the residue produced by laser irradiation hardly adheres to the surface of a plate and therefore the printing deficiency and the decrease in resolution caused by the adhesion of the residue are inhibited effectively.

EXAMPLES

The present invention will now be further illustrated by way of the following Examples although the present invention is not limited thereto.

Example 1

A resin composition was obtained by mixing 80 parts by weight of a carboxy-modified butadiene latex (NALSTAR MR171 produced by NIPPON A&L INC., degree of gelation of 75%, average particle diameter of 0.201 μm, and content of nonvolatiles of 48%) as a latex (A), 30 parts by weight of an oligobutadiene acrylate (molecular weight of about 2700), 4 parts by weight of monofunctional methacrylate and 4 parts by weight of trifunctional methacrylate as photopolymerizable compounds (B), 1 part by weight of benzyl dimethyl ketal as a photopolymerization initiator (C), 4.5 parts by weight of PFT-3 (a compound of about 20,000 in molecular weight having an urethane urea structure, nonvolatile content of 25%) produced by Kyoeisha Chemistry Co., Ltd. as a hydrophillic polymer and 0.1 parts by weight of hydroquinone monomethyl ether as a polymerization inhibitor, in a container together with 15 parts by weight of toluene; kneading them at 105° C. using a pressurizing kneader; and then removing toluene and water under reduced pressure.

Then, the resulting resin composition was sandwiched between a film composed of a polyethylene terephthalate film having a thickness of 125 μm coated with a polyester-based adhesive layer and a film composed of a polyethylene terephthalate film the same as the foregoing one coated with an anti-adhesive layer (polyvinyl alcohol) so that the adhesive layer and the anti-adhesive layer could come into contact with the resin composition, and then pressed with a heat pressing machine at 105° C. for 1 min at a pressure of 100 $kg/cm^2$, thereby obtaining a sheet-like molded material having a thickness of 1.7 mm. Subsequently, both sides of this sheet-like molded material were exposed to light for ten minutes using an UV exposure machine (light source: 10R manufactured by Koninklijke Philips Electronics) to crosslink and cure, thereby producing a printing original plate.

Example 2

A resin composition was obtained by mixing 96 parts by weight of a nitrile-butadiene latex (CYATEX NA-11 produced by NIPPON A&L INC., degree of gelation of 90%, average particle diameter of 0.14 μm, and content of nonvolatiles of 40%) as a latex (A), 20 parts by weight of an oligobutadiene acrylate (molecular weight of about 2700), 10 parts by weight of monofunctional methacrylate and 2 parts by weight of trifunctional methacrylate as photopolymerizable compounds (B), 1 part by weight of benzyl dimethyl ketal as a photopolymerization initiator (C), 6 parts by weight of liquid butadiene rubber (molecular weight of about 2000) as a plasticizer, 4.5 parts by weight of PFT-3 (a compound of about 20,000 in molecular weight having an urethane urea structure, nonvolatile content of 25%) produced by Kyoeisha Chemistry Co., Ltd. as a hydrophillic polymer and 0.1 parts by weight of hydroquinone monomethyl ether as a polymerization inhibitor, in a container together with 15 parts by weight of toluene; kneading them at 105° C. using a pressurizing kneader; and then removing toluene and water under reduced pressure. A printing original plate was produced in the same manner as in Example 1 using this resin composition.

Example 3

A resin composition was obtained by mixing 84 parts by weight of a styrene-butadiene latex (NALSTAR SR-101 produced by NIPPON A&L INC., degree of gelation of 95%, average particle diameter of 0.13 μm, and content of nonvolatiles of 46%) as a latex (A), 16 parts by weight of an oligobutadiene acrylate (molecular weight of about 2700), 10 parts by weight of monofunctional methacrylate and 2 parts by weight of trifunctional methacrylate as photopolymerizable compounds (B), 1 part by weight of benzyl dimethyl ketal as a photopolymerization initiator (C), 10 parts by weight of liquid butadiene rubber (molecular weight of about 2000) as a plasticizer, 4.5 parts by weight of PFT-3 (a compound of about 20,000 in molecular weight having an urethane urea structure, nonvolatile content of 25%) produced by Kyoeisha Chemistry Co., Ltd. as a hydrophillic polymer and 0.1 parts by weight of hydroquinone monomethyl ether as a polymerization inhibitor, in a container together with 15 parts by weight of toluene; kneading them at 105° C. using a pressurizing kneader; and then removing toluene and water under reduced pressure. A printing original plate was produced in the same manner as in Example 1 using this resin composition.

Example 4

A resin composition was obtained by mixing 82 parts by weight of a methyl methacrylate-butadiene latex (NALSTAR MR-170 produced by NIPPON A&L INC., degree of gelation of 100%, average particle diameter of 0.15 μm, and content of nonvolatiles of 45%) as a latex (A), 30 parts by weight of an oligobutadiene acrylate (molecular weight of about 2700), 5 parts by weight of monofunctional methacrylate and 3 parts by weight of trifunctional methacrylate as photopolymerizable compounds (B), 1 part by weight of benzyl dimethyl ketal as a photopolymerization initiator (C), 4.5 parts by weight of PFT-3 (a compound of about 20,000 in molecular weight having an urethane urea structure, nonvolatile content of 25% produced by Kyoeisha Chemistry Co., Ltd. as a hydrophillic polymer and 0.1 parts by weight of hydroquinone monomethyl ether as a polymerization inhibitor, in a container together with 15 parts by weight of toluene; kneading them at 105° C. using a pressurizing kneader; and then removing toluene and water under reduced pressure. A printing original plate was produced in the same manner as in Example 1 using this resin composition.

Example 5

A resin composition was obtained by mixing 58 parts by weight of a carboxy-modified styrene-butadiene latex (NALSTAR SR-101 produced by NIPPON A&L INC., degree of gelation of 95%, average particle diameter of 0.24 μm, and content of nonvolatiles of 52%) and 18 parts by weight of an acrylonitrile-butadiene latex (Nipol SX1503 produced by NIPPON ZEON CORPORATION, degree of gelation of 0%, average particle diameter of 0.05 μm, and content of nonvolatiles of 43%) as latices (A), 30 parts by weight of an oligobutadiene acrylate (molecular weight of about 2700), 4 parts by weight of monofunctional methacrylate and 4 parts by weight of trifunctional methacrylate as photopolymerizable compounds (B), 1 part by weight of benzyl dimethyl ketal as a photopolymerization initiator (C), 4 parts by weight of liquid butadiene rubber (molecular weight of about 2000) as a plasticizer, 4.5 parts by weight of PFT-3 (a compound of about 20,000 in molecular weight having an urethane urea structure, nonvolatile content of 25%) produced by Kyoeisha Chemistry Co., Ltd. as a hydrophillic polymer and 0.1 parts by weight of hydroquinone monomethyl ether as a polymerization inhibitor, in a container together with 15 parts by weight of toluene; kneading them at 105° C. using a pressurizing kneader; and then removing toluene and water under reduced pressure. A printing original plate was produced in the same manner as in Example 1 using this resin composition.

Example 6

A resin composition was obtained by mixing 59 parts by weight of a carboxy-modified styrene-butadiene latex (NALSTAR SR-101 produced by NIPPON A&L, INC., degree of gelation of 95%, average particle diameter of 0.24 μm, and content of nonvolatiles of 52%) and 20 parts by weight of a nitrile-butadiene latex (CYATEX NA-105S produced by NIPPON A&L INC., degree of gelation of 35%, average particle diameter of 0.16 μm, and content of nonvolatiles of 50%) as latices (A), 30 parts by weight of an oligobutadiene acrylate (molecular weight of about 2700), 4 parts by weight of monofunctional methacrylate and 4 parts by weight of trifunctional methacrylate as photopolymerizable compounds (B), 1 part by weight of benzyl dimethyl ketal as a photopolymerization initiator (C), 4 parts by weight of liquid butadiene rubber (molecular weight of about 2000) as a plasticizer, 4.5 parts by weight of PFT-3 (a compound of about 20,000 in molecular weight having an urethane urea structure, nonvolatile content of 25%) produced by Kyoeisha Chemistry Co., Ltd. as a hydrophillic polymer and 0.1 parts by weight of hydroquinone monomethyl ether as a polymerization inhibitor, in a container together with 15 parts by weight of toluene; kneading them at 105° C. using a pressurizing kneader; and then removing toluene and water under reduced pressure. A printing original plate was produced in the same manner as in Example 1 using this resin composition.

Example 7

A resin composition was obtained by mixing 63 parts by weight of a carboxy-modified styrene-butadiene latex (NALSTAR SR-101 produced by NIPPON A&L INC., degree of gelation of 95%, average particle diameter of 0.24 μm, and content of nonvolatiles of 52%) and 20 parts by weight of a carboxy-modified methyl methacrylate-butadiene latex (NALSTAR MR-171 produced by NIPPON A&L INC., degree of gelation of 75%, average particle diameter of 0.20 μm, and content of nonvolatiles of 48%) as latices (A), 30 parts by weight of an oligobutadiene acrylate (molecular weight of about 2700), 4 parts by weight of monofunctional methacrylate and 4 parts by weight of trifunctional methacrylate as photopolymerizable compounds (B), 1 part by weight of benzyl dimethyl ketal as a photopolymerization initiator (C), 4 parts by weight of liquid butadiene rubber (molecular weight of about 2000) as a plasticizer, 4.5 parts by weight of PFT-3 (a compound of about 20,000 in molecular weight having an urethane urea structure, nonvolatile content of 25%) produced by Kyoeisha Chemistry Co., Ltd. as a hydrophillic polymer and 0.1 parts by weight of hydroquinone monomethyl ether as a polymerization inhibitor, in a container together with 15 parts by weight of toluene; kneading them at 105° C. using a pressurizing kneader; and then removing toluene and water under reduced pressure. A printing original plate was produced in the same manner as in Example 1 using this resin composition.

Comparative Example 1

A resin composition was obtained by mixing 77 parts by weight of a nitrile-butadiene latex (CYATEX NA-105S produced by NIPPON A&L INC., degree of gelation of 35%, average particle diameter of 0.16 and content of nonvolatiles of 50%) as a latex (A), 30 parts by weight of an oligobutadiene acrylate (molecular weight of about 2700), 4 parts by weight of monofunctional methacrylate and 4 parts by weight of trifunctional methacrylate as photopolymerizable compounds (B), 1 part by weight of benzyl dimethyl ketal as a photopolymerization initiator (C), 4 parts by weight of liquid butadiene rubber (molecular weight of about 2000) as a plasticizer, 4.5 parts by weight of PFT-3 (a compound of about 20,000 in molecular weight having an urethane urea structure, nonvolatile content of 25%) produced by Kyoeisha Chemistry Co., Ltd. as a hydrophillic polymer and 0.1 parts by weight of hydroquinone monomethyl ether as a polymerization inhibitor, in a container together with 15 parts by weight of toluene; kneading them at 105° C. using a pressurizing kneader; and then removing toluene and water under reduced pressure. A printing original plate was produced in the same manner as in Example 1 using this resin composition.

Comparative Example 2

A resin composition was obtained by mixing 77 parts by weight of a carboxy-modified styrene-butadiene latex (NALSTAR SR-112 produced by NIPPON A&L INC., degree of gelation of 70%, average particle diameter of 0.13 μm, and content of nonvolatiles of 50%) as a latex (A), 30 parts by weight of an oligobutadiene acrylate (molecular weight of about 2700), 4 parts by weight of monofunctional methacrylate and 4 parts by weight of trifunctional methacrylate as photopolymerizable compounds (B), 1 part by weight of benzyl dimethyl ketal as a photopolymerization initiator (C), 4 parts by weight of liquid butadiene rubber (molecular weight of about 2000) as a plasticizer, 4.5 parts by weight of PFT-3 (a compound of about 20,000 in molecular weight having an urethane urea structure, nonvolatile content of 25%) produced by Kyoeisha Chemistry Co., Ltd. as a hydrophillic polymer and 0.1 parts by weight of hydroquinone monomethyl ether as a polymerization inhibitor, in a container together with 15 parts by weight of toluene; kneading them at 105° C. using a pressurizing kneader; and then removing toluene and water under reduced pressure. A printing original plate was produced in the same manner as in Example 1 using this resin composition.

Comparative Example 3

A resin composition was obtained by mixing 20 parts by weight of a butadiene rubber (BR02 produced by Japan Synthetic Rubber Co., Ltd., degree of gelation of 0% and Mooney viscosity at 100° C.: 43) and 32 parts by weight of a nitrile-butadiene rubber (N220SH produced by Japan Synthetic Rubber Co., Ltd., degree of gelation of 0% and Mooney viscosity at 100° C.: 80) instead of a latex (A), 35 parts by weight of an oligobutadiene acrylate (molecular weight of about 2700), 4 parts by weight of monofunctional methacrylate and 2 parts by weight of trifunctional methacrylate as photopolymerizable compounds (B), 1 part by weight of benzyl dimethyl ketal as a photopolymerization initiator (C), 20 parts by weight of silica (average primary particle diameter of 0.017 μm) as inorganic fine particles, 14 parts by weight of PFT-3 (a compound of about 20,000 in molecular weight having an urethane urea structure, nonvolatile content of 25%) produced by Kyoeisha Chemistry Co., Ltd. as a hydrophillic polymer and 0.1 parts by weight of hydroquinone monomethyl ether as a polymerization inhibitor, in a container together with 60 parts by weight of toluene; kneading them at 105° C. using a pressurizing kneader; and then removing toluene under reduced pressure. A printing original plate was produced in the same manner as in Example 1 using this resin composition.

Comparative Example 4

A resin composition was obtained by mixing 25 parts by weight of a carboxy-modified styrene-butadiene latex (NALSTAR SR-101 produced by NIPPON A&L INC., degree of gelation of 95%, average particle diameter of 0.24 μm, and content of nonvolatiles of 52%) and 65 parts by weight of an acrylonitrile-butadiene latex (Nipol SX1503 produced by NIPPON ZEON CORPORATION, degree of gelation of 0%, average particle diameter of 0.05 μm, and content of nonvolatiles of 43%) as latices (A), 30 parts by weight of an oligobutadiene acrylate (molecular weight of about 2700), 4 parts by weight of monofunctional methacrylate and 4 parts by weight of trifunctional methacrylate as photopolymerizable compounds (B), 1 part by weight of benzyl dimethyl ketal as a photopolymerization initiator (C), 4 parts by weight of liquid butadiene rubber (molecular weight of about 2000) as a plasticizer, 4.5 parts by weight of PFT-3 (a compound of about 20,000 in molecular weight having an urethane urea structure, nonvolatile content of 25%) produced by Kyoeisha Chemistry Co., Ltd. as a hydrophillic polymer and 0.1 parts by weight of hydroquinone monomethyl ether as a polymerization inhibitor, in a container together with 15 parts by weight of toluene; kneading them at 105° C. using a pressurizing kneader; and then removing toluene and water under reduced pressure. A printing original plate was produced in the same manner as in Example 1 using this resin composition.

Comparative Example 5

A resin composition was obtained by mixing 39 parts by weight of a carboxy-modified styrene-butadiene latex (NALSTAR SR-101 produced by NIPPON A&L INC., degree of gelation of 95%, average particle diameter of 0.24 μm, and content of nonvolatiles of 52%) and 30 parts by weight of a nitrile-butadiene latex (CYATEX NA-105S produced by NIPPON A&L INC., degree of gelation of 35%, average particle diameter of 0.16 μm, and content of nonvolatiles of 50%) as latices (A), 30 parts by weight of an oligobutadiene acrylate (molecular weight of about 2700), 4 parts by weight of monofunctional methacrylate and 4 parts by weight of trifunctional methacrylate as photopolymerizable compounds (B), 1 part by weight of benzyl dimethyl ketal as a photopolymerization initiator (C), 4 parts by weight of liquid butadiene rubber (molecular weight of about 2000) as a plasticizer, 4.5 parts by weight of PFT-3 (a compound of about 20,000 in molecular weight having an urethane urea structure, nonvolatile content of 25%) produced by Kyoeisha Chemistry Co., Ltd. as a hydrophillic polymer and 0.1 parts by weight of hydroquinone monomethyl ether as a polymerization inhibitor, in a container together with 15 parts by weight of toluene; kneading them at 105° C. using a pressurizing kneader; and then removing toluene and water under reduced pressure. A printing original plate was produced in the same manner as in Example 1 using this resin composition.

Comparative Example 6

A resin composition was obtained by mixing 22 parts by weight of a butadiene latex (Nipol LX111NF produced by NIPPON ZEON CORPORATION, degree of gelation of 86%, average particle diameter of 0.35 μm, and content of nonvolatiles of 55%) and 5 parts by weight of an acrylonitrile-butadiene latex (Nipol SX1503 produced by NIPPON ZEON CORPORATION, degree of gelation of 0%, average particle diameter of 0.05 μm, and content of nonvolatiles of 43%) as latices (A), 10 parts by weight of an oligobutadiene acrylate (molecular weight of about 2700) as a photopolymerizable compound (B), 0.45 part by weight of benzyl dimethyl ketal as a photopolymerization initiator (C), 5 parts by weight of PFT-3 (a compound of about 20,000 in molecular weight having an urethane urea structure, nonvolatile content of 25%) produced by Kyoeisha Chemistry Co., Ltd. as a hydrophillic polymer, 3 parts by weight of lauryl methacrylate and 0.9 parts by weight of dimethylol tricyclodecane diacrylate as crosslinking agents, 0.03 parts by weight of hydroquinone monomethyl ether as a polymerization inhibitor and 0.04 parts by weight of carboxylic copolymer as an other additive, in a container together with 15 parts by weight of toluene; kneading them at 105° C. using a pressurizing kneader; and then removing toluene and water under reduced pressure. A printing original plate was produced in the same manner as in Example 1 using this resin composition.

Next, the printing original plates produced in Examples 1 to 7 and Comparative Examples 1 to 6 were wound with a double-sided tape on a plate-mounting drum of a laser engraving device, followed by laser engraving under the conditions shown below. A dust collector located near a laser gun was operated simultaneously with the start of the laser engraving, thereby discharging the engraved residue out of the device continuously. After the laser engraving, the plates were dismounted from the mounting drum and were washed with water for 3 minutes using a washer for water-developable plates (CRS600, manufactured by Toyobo Co., Ltd.; the developer was a 1% aqueous laundry soap solution; the water temperature was 40° C.) to remove a small amount of residue on the surface of the plates. The plates were then dried to obtain printing plates.

The laser engraving device used was a FlexPose ! direct equipped with a 300 W carbon dioxide laser, manufactured by Luescher Flexo. The specifications of the device included a laser wavelength of 10.6 μm, a beam diameter of 30 μm, a plate-mounting drum diameter of 300 mm and a processing rate of 1.5 hours/0.5 $m^2$. The conditions of the laser engraving are as follows. Here, (1) to (3) are conditions inherent to the device. For conditions (4) to (7), which may be set arbitrarily, standard conditions of the device were adopted, respectively.

(1) Resolution: 2540 dpi
(2) Laser pitch: 10 μm
(3) The number of drum rotations: 982 cm/sec.
(4) Top power: 9%
(5) Bottom power: 100%
(6) Shoulder width: 0.30 mm
(7) Relief depth: 0.60 mm
(8) Evaluated image: 150 lpi, screen dots at every 1% from 0 to 100%

The printing plates obtained were investigated for the following evaluation items.

(1) Condition of Residue Adhesion to the Surface of a Printing Plate

Using a magnifying lens of 10 magnifications, the condition of residue adhesion to the surface of a printing plate was inspected visually and was expressed in the following four levels: ⊙ almost no residue was found; ○ a little residue was found; Δ a considerable amount of residue was found; x a great amount of residue was found.

(2) Reproduction of minimum screen dot at 150 lpi

The reproduction of minimum screen dot at 150 lpi was measured using a magnifying lens of 10 magnifications.

(3) Depth of 10% screen dot at 150 lpi

The depth of 10% screen dot at 150 lpi was measured using an ultra-deep color 3D profile measuring microscope (VK-9510 manufactured by KEYENCE CORPORATION).

The evaluation results are shown in Table 1.

TABLE 1

The evaluation results of the printing plate

| | Elastomers used in Examples | Weight average degree of gelation of elastomers | Inorganic fine particles | Condition of residue adhesion to the surface of a printing plate | Reproduction of minimum screen dot at 150 lpi | Depth of 10% screen dot at 150 lpi |
|---|---|---|---|---|---|---|
| Example 1 | carboxy-modified butadiene latex | 75 | unincorporated | ⊙ | 1% | 83 |
| Example 2 | nitrile-butadiene latex | 90 | unincorporated | ⊙ | 1% | 81 |
| Example 3 | styrene-butadiene latex | 95 | unincorporated | ⊙ | 1% | 85 |
| Example 4 | methyl methacrylate-butadiene latex | 100 | unincorporated | ⊙ | 1% | 81 |
| Example 5 | carboxy-modified styrene-butadiene latex/acrylonitrile-butadiene latex | 75.60 | unincorporated | ⊙ | 1% | 81 |
| Example 6 | carboxy-modified styrene-butadiene latex/nitrile-butadiene latex | 80.25 | unincorporated | ⊙ | 1% | 83 |

TABLE 1-continued

The evaluation results of the printing plate

| | Elastomers used in Examples | Weight average degree of gelation of elastomers | Inorganic fine particles | Condition of residue adhesion to the surface of a printing plate | Reproduction of minimum screen dot at 150 lpi | Depth of 10% screen dot at 150 lpi |
|---|---|---|---|---|---|---|
| Example 7 | carboxy-modified styrene-butadiene latex/carboxy-modified methyl methacrylate-butadiene latex | 90.47 | unincorporated | ⊙ | 1% | 83 |
| Comparative Example 1 | nitrile-butadiene latex | 35 | unincorporated | Δ | 3% | 44 |
| Comparative Example 2 | carboxy-modified styrene-butadiene latex | 70 | unincorporated | ○ | 1% | 67 |
| Comparative Example 3 | butadiene rubber, nitrile-butadiene rubber | 0 | incorporated | Δ | 5% | 32 |
| Comparative Example 4 | carboxy-modified styrene-butadiene latex/acrylonitrile-butadiene latex | 30.16 | unincorporated | Δ | 3% | 41 |
| Comparative Example 5 | carboxy-modified styrene-butadiene latex/nitrile-butadiene latex | 69.49 | unincorporated | ○ | 1% | 64 |
| Comparative Example 6 | butadiene latex/acrylonitrile-butadiene latex | 73.02 | unincorporated | ○ | 1% | 69 |

From the evaluation results in Table 1, it is understood that in Examples 1 to 7 where latices having a degree of gelation of 75% or higher were used, a printing plate having only a little amount of residue adhered to the surface of the printing plate, being excellent in reproducibility of fine screen dots and having a screen dot depth of 80 μm or more was obtained. On the other hand, Comparative Examples 1, 2 and 4 to 6 using latices having a degree of gelation of less than 75%, in which a residue was left adhered to the surface of a printing plate, were inferior to Examples 1 to 7 in either the reproducibility of fine screen dots or the screen dot depth. Further, Comparative Example 3, in which a rubber was used as an elastomer and inorganic fine particles were incorporated, was far inferior to Examples 1 to 6 with respect to all of the amount of adhered residue, the reproducibility of fine screen dots and the screen dot depth. The results described above clearly show that the use of the printing original plate of the present invention can effectively inhibit adhesion of a residue produced by laser irradiation to cause no printing deficiency and can provide excellent resolution.

INDUSTRIAL APPLICABILITY

The printing original plate of the present invention exhibits low tackiness and almost no residue produced by laser irradiation in the preparation of a printing plate is allowed to be left adhered to the surface of the plate. Therefore, it can be used suitably for laser engraving in the field of flexographic printing.

What is claimed is:

1. A printing original plate for laser engraving, comprising: a molded article comprising:
   (A) a latex component comprising a first latex and a second latex different from the first latex, in which the first latex comprises a gelled latex and the latex component has a weight average degree of gelation of 85% or more; and
   (B) a cured photopolymerizable compound.

2. The printing original plate of claim 1, wherein the gelled latex comprises a polybutadiene latex, a nitrile-butadiene copolymer latex, a styrene-butadiene copolymer latex, an acrylonitrile-butadiene copolymer latex, or a methyl metacrylate-butadiene copolymer latex.

3. The printing original plate of claim 1, wherein the second latex comprises an ungelled latex.

4. The printing original plate of claim 3, wherein the ungelled latex comprises an acrylonitrile-butadiene copolymer latex.

5. The printing original plate of claim 3, wherein the weight ratio of the ungelled latex in the latex component (A) is 20% by weight or less.

6. The printing original plate of claim 1, wherein the cured photopolymerizable compound is made from a diene-based ethylenic polymer.

7. The printing original plate of claim 1, wherein the diene-based ethylenic polymer comprises an ethylenically unsaturated group linked to a terminal or side chain of the diene-based ethylenic polymer.

8. A printing original plate for laser engraving, comprising: a molded article comprising:
   (A) a latex component comprising at least one latex, in which the at least one latex comprises a gelled latex and the latex component has a weight average degree of gelation of 90% or more; and
   (B) a cured photopolymerizable compound made from a diene-based ethylenic polymer.

9. The printing original plate of claim 1, wherein the latex component has a weight average degree of gelation of 90% or more.

10. The printing original plate of claim 8, wherein the gelled latex comprises a polybutadiene latex, a nitrile-butadiene copolymer latex, a styrene-butadiene copolymer latex, an acrylonitrile-butadiene copolymer latex, or a methyl metacrylate-butadiene copolymer latex.

11. The printing original plate of claim 8, wherein the diene-based ethylenic polymer comprises an ethylenically unsaturated group linked to a terminal or side chain of the diene-based ethylenic polymer.

* * * * *